(12) United States Patent
Kojima et al.

(10) Patent No.: US 11,316,440 B2
(45) Date of Patent: Apr. 26, 2022

(54) POWER CONVERSION APPARATUS

(71) Applicant: DENSO CORPORATION, Kariya (JP)

(72) Inventors: Kazunari Kojima, Kariya (JP); Norihiro Tanaka, Kariya (JP); Takaaki Goto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/079,671

(22) Filed: Oct. 26, 2020

(65) Prior Publication Data

US 2021/0044213 A1 Feb. 11, 2021

Related U.S. Application Data

(63) Continuation of application No. PCT/JP2019/016732, filed on Apr. 19, 2019.

(30) Foreign Application Priority Data

Apr. 25, 2018 (JP) .............................. JP2018-084046
Jan. 29, 2019 (JP) .............................. JP2019-012926

(51) Int. Cl.
*H05K 7/20* (2006.01)
*H02M 7/00* (2006.01)
*H02P 27/06* (2006.01)

(52) U.S. Cl.
CPC .......... *H02M 7/003* (2013.01); *H05K 7/2089* (2013.01); *H02P 27/06* (2013.01)

(58) Field of Classification Search
None
See application file for complete search history.

(56) References Cited

U.S. PATENT DOCUMENTS

| 5,761,028 | A | * | 6/1998 | Donegan | H01L 25/072 |
| | | | | | 361/679.01 |
| 9,668,376 | B2 | * | 5/2017 | Riedel | H05K 7/1432 |
| 10,348,064 | B2 | * | 7/2019 | Jung | H02J 3/18 |
| 10,652,997 | B2 | * | 5/2020 | Yoshikawa | H01L 25/115 |
| 10,660,229 | B2 | * | 5/2020 | Umeda | B60L 50/51 |
| 10,842,055 | B2 | * | 11/2020 | Hirose | H02M 7/537 |
| 10,964,480 | B2 | * | 3/2021 | Kanda | H01G 4/38 |
| 11,070,140 | B2 | * | 7/2021 | Nojima | H02M 7/003 |
| 2008/0136265 | A1 | * | 6/2008 | Mizukoshi | H02K 11/33 |
| | | | | | 307/89 |

(Continued)

FOREIGN PATENT DOCUMENTS

JP 2009-111435 A 5/2009

*Primary Examiner* — Courtney L Smith
(74) *Attorney, Agent, or Firm* — Oliff PLC (57) ABSTRACT

A power conversion apparatus has: a heat-generating component; and a first capacitor module and a second capacitor module that are arranged to face each other with the heat-generating component therebetween. The first capacitor module has a first capacitor element, a first case that accommodates the first capacitor element, and a first bus bar with one end connected to the first capacitor element. The second capacitor module has a second capacitor element, a second case that accommodates the second capacitor element, and a second bus bar with one end connected to the second capacitor element. The second bus bar has an intervening part that intervenes between the second capacitor element and the heat-generating component, in a state of being separated from the two.

9 Claims, 11 Drawing Sheets

(56) References Cited

U.S. PATENT DOCUMENTS

2010/0321889 A1* 12/2010 Yoshino ............ H05K 7/20927
361/702
2014/0285969 A1* 9/2014 Kojima ................ H01G 2/106
361/689

* cited by examiner

POWER CONVERSION APPARATUS

CROSS-REFERENCE TO RELATED APPLICATION

This application is the U.S. bypass application of International Application No. PCT/JP2019/016732 filed Apr. 19, 2019 which designated the U.S. and claims priority to Japanese Patent Application No. 2018-084046, filed Apr. 25, 2018 and Japanese Patent Application No. 2019-012926 filed on Jan. 29, 2019, the contents of which are incorporated herein by reference.

BACKGROUND

Technical Field

The present disclosure relates to a power conversion apparatus.

In this field, some power conversion apparatuses such as inverters mounted in electric automobiles or hybrid automobiles include a switching circuit part and a capacitor module. As an example, Japanese Patent Application Laid-Open Publication No. 2009-111435 discloses a power conversion apparatus in which a plurality of capacitor modules are arranged. This technique increases the whole capacity of the capacitor while facilitating space saving.

SUMMARY

One aspect of the present disclosure is in a power conversion apparatus having: a heat-generating component; and a first capacitor module and a second capacitor module that are arranged to face each other with the heat-generating component therebetween. The first capacitor module has a first capacitor element, a first case that accommodates the first capacitor element, and a first bus bar with one end connected to the first capacitor element, the second capacitor module has a second capacitor element, a second case that accommodates the second capacitor element, and a second bus bar with one end connected to the second capacitor element, and the second bus bar has an that intervenes between the second capacitor element and the heat-generating component, in a state of being separated from the two.

BRIEF DESCRIPTION OF THE DRAWINGS

The foregoing and other objects, features, and advantages of the present disclosure will be more clarified by the following detailed descriptions with reference to the accompanying drawings. The drawings are as follows.

DETAILED DESCRIPTION OF THE PREFERRED EMBODIMENTS

According to a conventional power conversion apparatus as mentioned above, in order to arrange a plurality of capacitor modules, it is necessary to design the capacitor modules allowing for heat damage to capacitor elements in the capacitor modules. Specifically, the power conversion apparatus has a heat-generating component such as a discharging resistor, and it is necessary to suppress the heat damage to the capacitor elements caused by the heat-generating component. On the other hand, from the viewpoint of downsizing of the power conversion apparatus, there arises a constraint on the relative positions of the plurality of capacitor modules and the heat-generating component.

Hereinafter, with reference to the drawings, embodiments of the present disclosure will be described.

First Embodiment

An embodiment of a power conversion apparatus will be described with reference to FIGS. 1 to 8.

Figure 1:
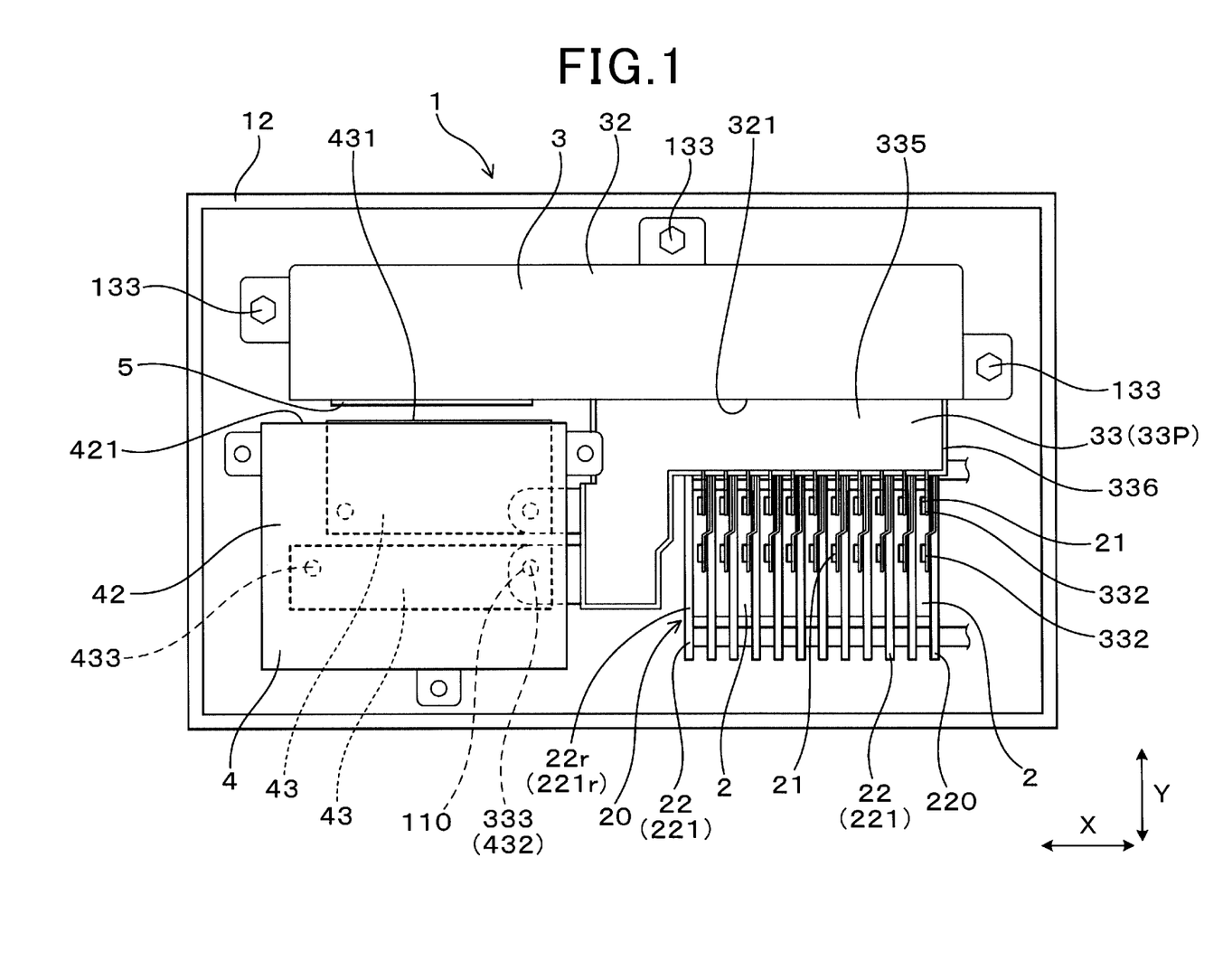
FIG. 1 is a descriptive plan view of a power conversion apparatus in a first embodiment.
Figure 2:
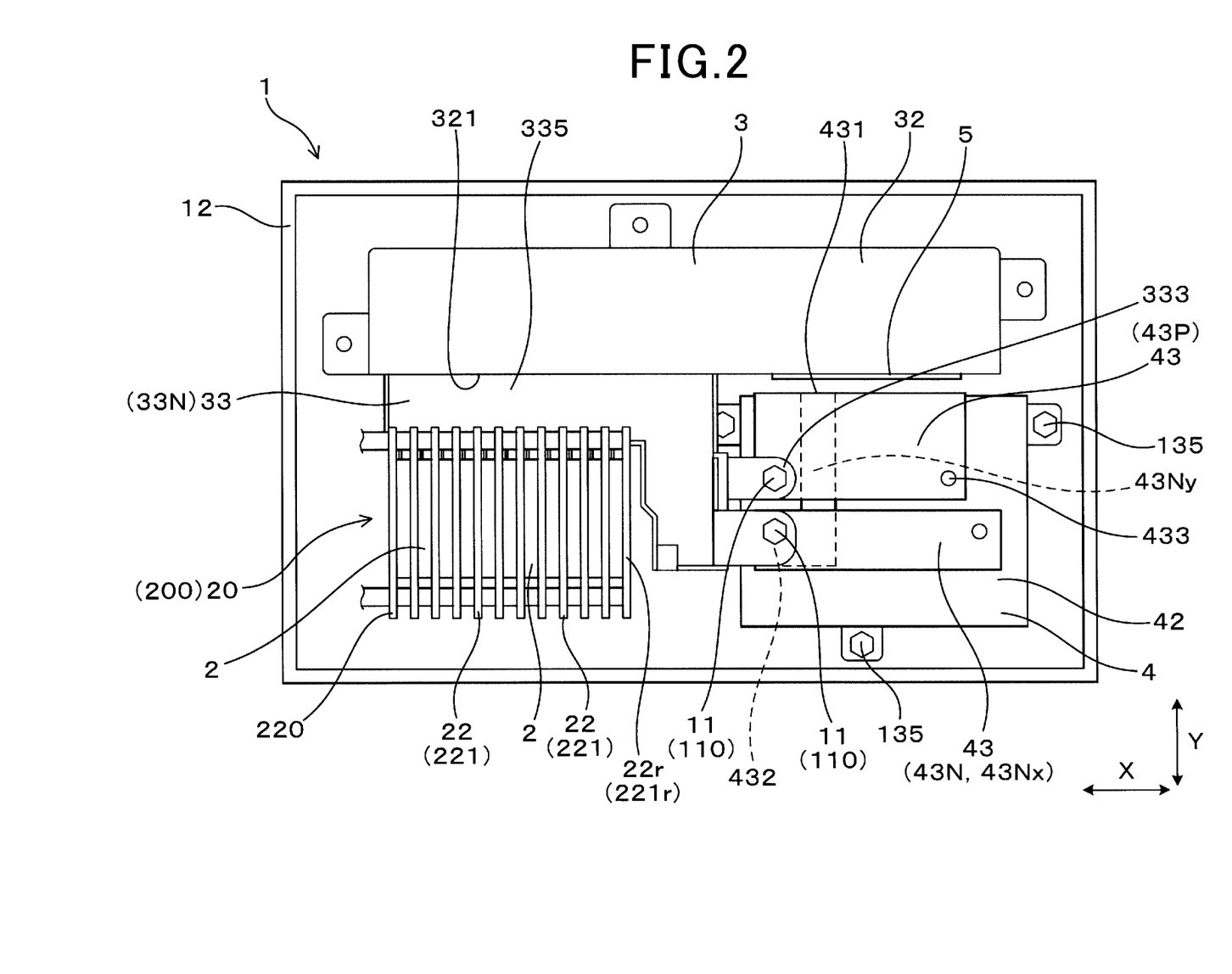
FIG. 2 is a descriptive plan view of the power conversion apparatus as viewed from the side opposite to FIG. 1 in the first embodiment.

The power conversion apparatus 1 in the present embodiment has a discharging resistor 5 as a heat-generating component, and a first capacitor module 3 and a second capacitor module 4 as shown in FIGS. 1 and 2. The first capacitor module 3 and the second capacitor module 4 are arranged to face each other with the discharging resistor 5 therebetween as shown in FIGS. 3 and 4.

The first capacitor module 3 has a first capacitor element 31, a first case 32, and a first bus bar 33 as shown in FIGS. 3 to 6. The first case 32 stores the first capacitor element 31. The first bus bar 33 has one end connected to the first capacitor element 31.

Figure 3:
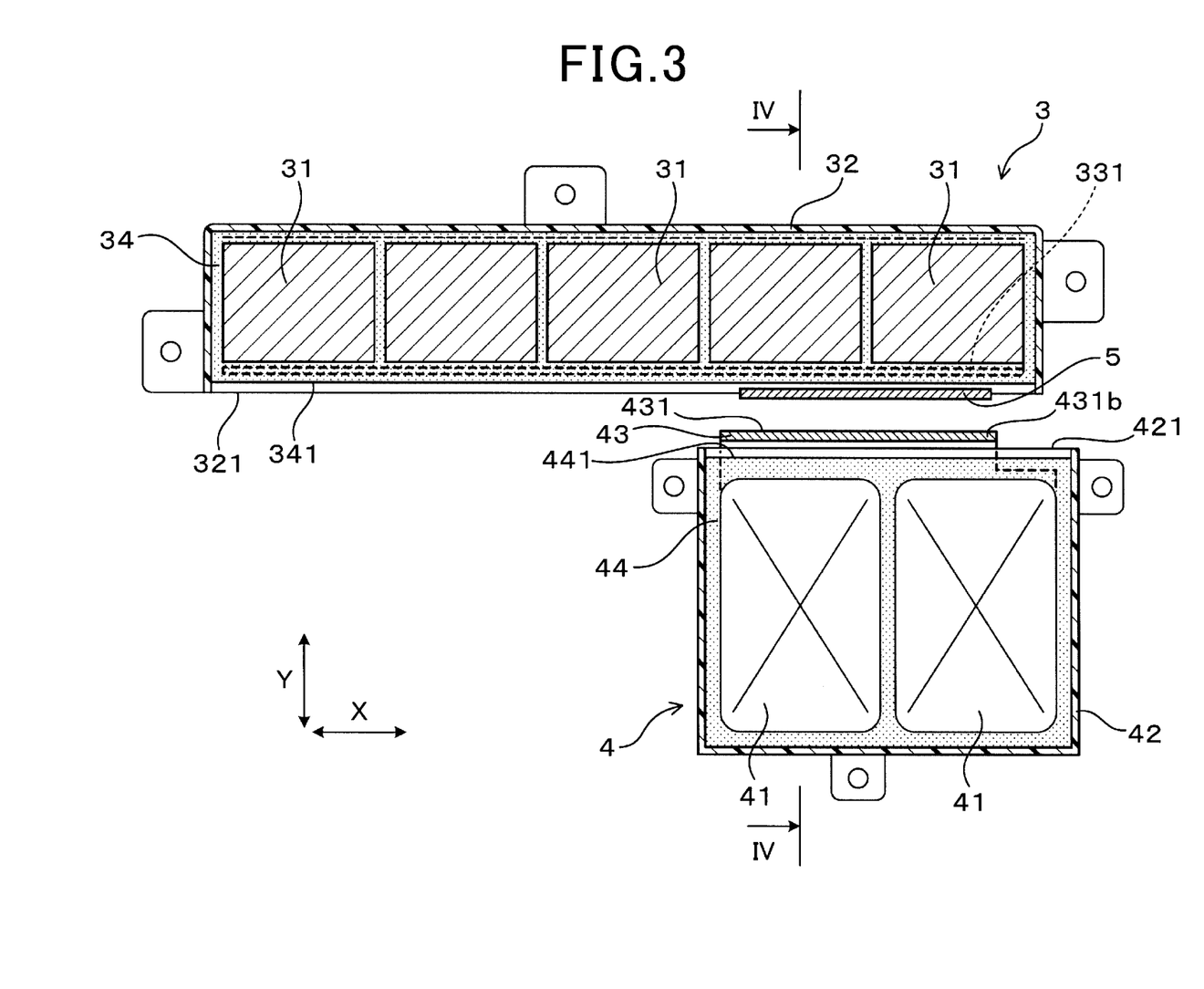
FIG. 3 is a cross-sectional view of a first capacitor module and a second capacitor module as viewed from a Z direction in the first embodiment, which corresponds to a cross-sectional view of FIG. 4 taken along line
Figure 4:
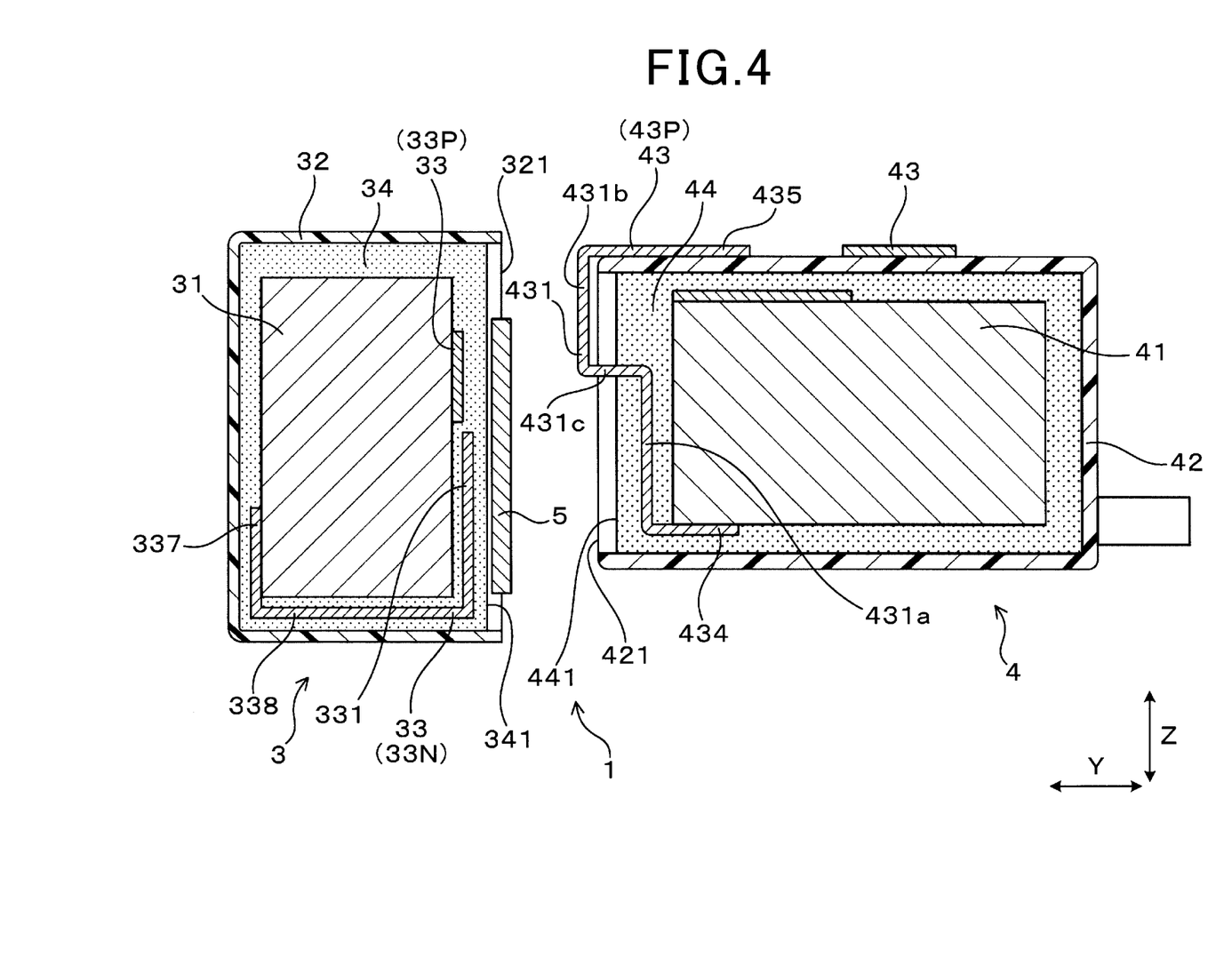
FIG. 4 is a cross-sectional view of FIG. 3 taken along line IV-IV.
Figure 7:
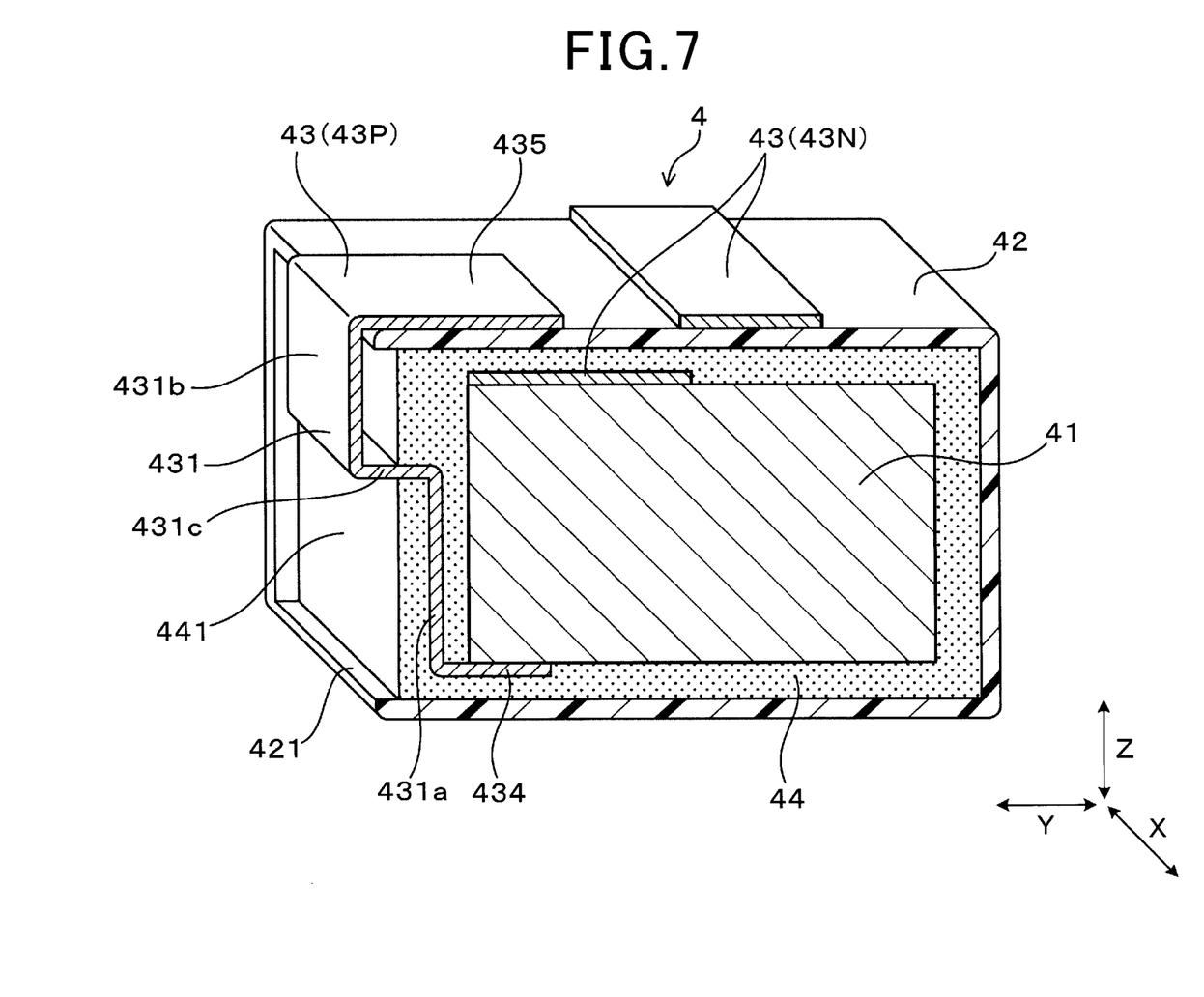
FIG. 7 is a perspective cross-sectional view of the second capacitor module in the first embodiment.

The second capacitor module 4 has a second capacitor element 41, a second case 42, and second bus bars 43 as shown in FIGS. 3, 4, and 7. The second case 42 stores the second capacitor element 41. The second bus bars 43 each have one end connected to the second capacitor element 41.

As shown in FIGS. 3 and 4, the second bus bars 43 have an intervening part 431 that intervenes between the second capacitor element 41 and the discharging resistor 5, in a state of being separated from the two. Specifically, the intervening part 431 is interposed between the second capacitor element 41 and the discharging resistor 5, but is separated from both the second capacitor element 41 and the discharging resistor 5. That is, in the aligning direction of the second capacitor element 41 and the discharging resistor 5, there are provided a gap between the second capacitor element 41 and the intervening part 431, and a gap between the intervening part 431 and the discharging resistor 5.

Figure 6:
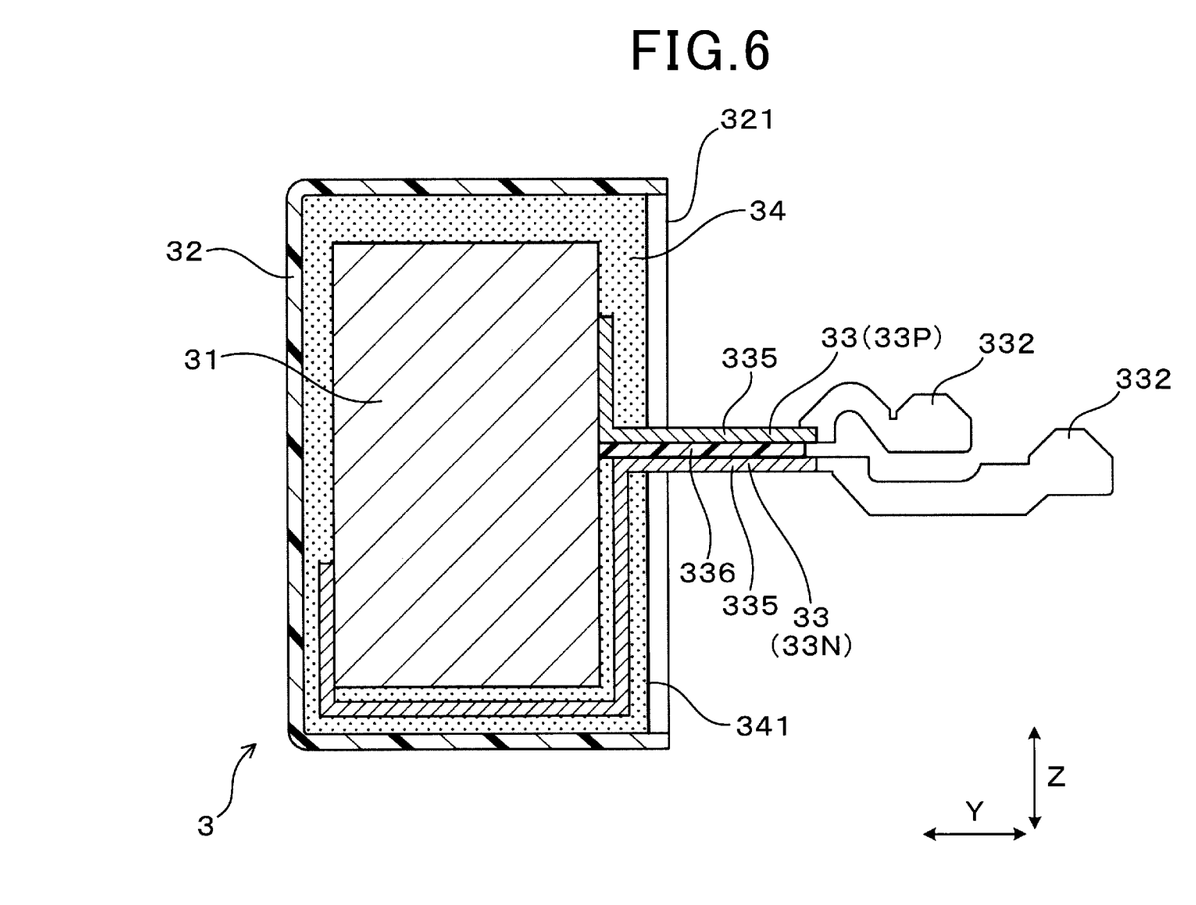
FIG. 6 is a vertically flipped diagram of a cross-sectional view of FIG. 5 taken along line VI-VI.

As shown in FIGS. 1, 2, and 6, the first bus bar 33 has terminal connection parts 332 connected to power terminals 21 of a switching circuit part 20. The switching circuit part 20 has semiconductor modules 2 and a cooler 220 that cools the semiconductor modules 2. The cooler 220 is formed of a plurality of cooling tubes 22. The cooling tubes 22 thermally contact the semiconductor modules 2 to cool the semiconductor modules 2.

Figure 8:
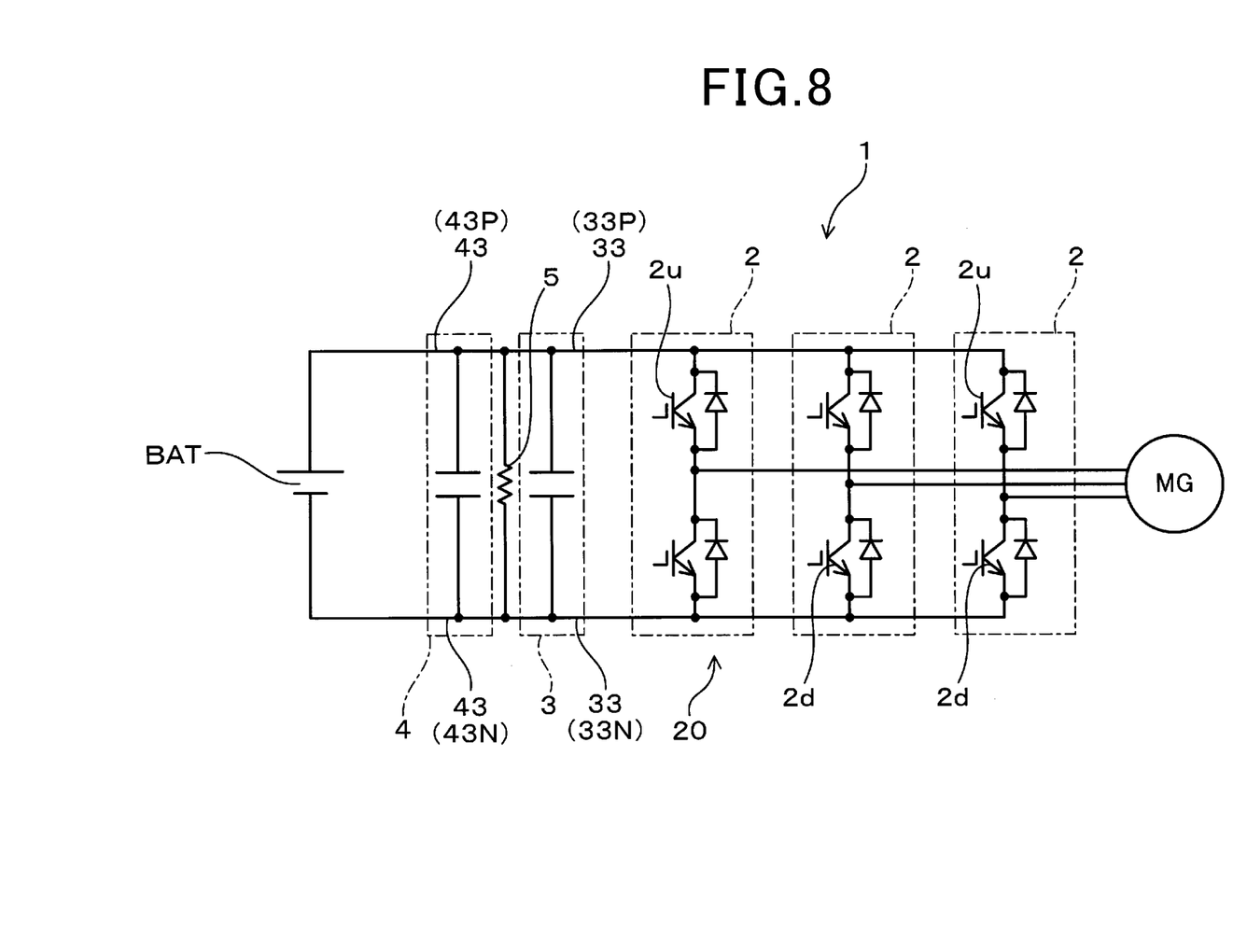
FIG. 8 is a circuit diagram of the power conversion apparatus in the first embodiment.

The power conversion apparatus 1 in the present embodiment is mounted in a vehicle such as an electric automobile or a hybrid automobile, and is connected between a direct-current power supply BAT and an alternating-current rotating electrical machine MG as shown in the circuit diagram of FIG. 8. The power conversion apparatus 1 is configured to perform power conversion between direct-current power and alternating-current power by switching operation in the switching circuit part 20.

The switching circuit part 20 includes a plurality of the semiconductor modules 2 containing switching elements $2u$ and $2d$. The plurality of semiconductor modules 2 are stacked together with the plurality of cooling tubes 22 as shown in FIGS. 1 and 2. The cooling tubes 22 each have a refrigerant flow path therein. The plurality of cooling tubes 22 form the cooler 220 with their refrigerant flow paths coupled to each other.

The semiconductor modules 2 have the power terminals 21 protruding in a direction orthogonal to a stacking direction X. Connected to these power terminals 21 are terminal connection parts 332 of the first bus bar 33 in the first capacitor module 3. In the following description, the stacking direction X will also be simply called X direction. The protruding direction of the power terminals 21 will be called Z direction as appropriate, and a direction orthogonal to both the X direction and the Z direction will be called Y direction as appropriate.

The plurality of semiconductor modules 2 are arranged to align in the Y direction with respect to the first capacitor module 3. The first capacitor module 3 has a shape elongated in the X direction. A stack body of the semiconductor modules 2 (that is, the switching circuit part 20) faces the first capacitor module 3 in the Y direction in substantially half of the longitudinal region of the first capacitor module 3. The first capacitor module 3 has an opening surface 321 of the first case 32 facing the switching circuit part 20 side in the Y direction. That is, first sealing resin 34 has a potting surface (that is, a first resin surface 341) facing the switching circuit part 20 side in the Y direction.

The semiconductor modules 2 each contain, as switching elements, the upper arm switching element $2u$ and the lower arm switching element $2d$ that are connected in series to each other. The upper arm switching element $2u$ has a high-potential side connected to the positive power terminal 21, and the lower arm switching element $2d$ has a low-potential side connected to the negative power terminal 21. The connection part of the upper arm switching element $2u$ and the lower arm switching element $2d$ is connected to an alternating-current terminal for output not illustrated in the drawings. The alternating-current terminal is connected to the rotating electrical machine MG.

As shown in FIGS. 1, 5, 6, and 8, the first bus bar 33 includes a positive first bus bar 33P and a negative first bus bar 33N that are connected to electrodes opposite to each other of the first capacitor element 31. The positive first bus bar 33P has terminal connection parts 332 connected to the positive power terminals 21, and the negative first bus bar 33N has terminal connection parts 332 connected to the negative power terminals 21.

The first bus bar 33 also has power source connection parts 333 that are the connection parts on the direct-current power source BAT side. The power source connection part 333 of the positive first bus bar 33P is electrically connected to the positive pole of the direct-current power source BAT, and the power source connection part 333 of the negative first bus bar 33N is electrically connected to the negative pole of the direct-current power source BAT.

As shown in FIGS. 1 and 2, the second capacitor module 4 is connected to the power source connection parts 333 of the first bus bar 33. Thus, as shown in FIG. 8, the first capacitor module 3 and the second capacitor module 4 are connected in parallel to each other. As shown in FIG. 2, the second capacitor module 4 is detachably fixed to the power source connection parts 333 by fastening members 11.

As shown in FIGS. 1 and 2, the second capacitor module 4 is arranged to align in the Y direction with the first capacitor module 3 and align in the X direction with respect to the switching circuit part 20. As shown in FIGS. 3 and 4, the discharge resistor 5 is interposed between the first capacitor module 3 and the second capacitor module 4 in the Y direction. The intervening part 431 of the second bus bars 43 intervenes between the discharging resistor 5 and the second capacitor element 41.

Figure 5:
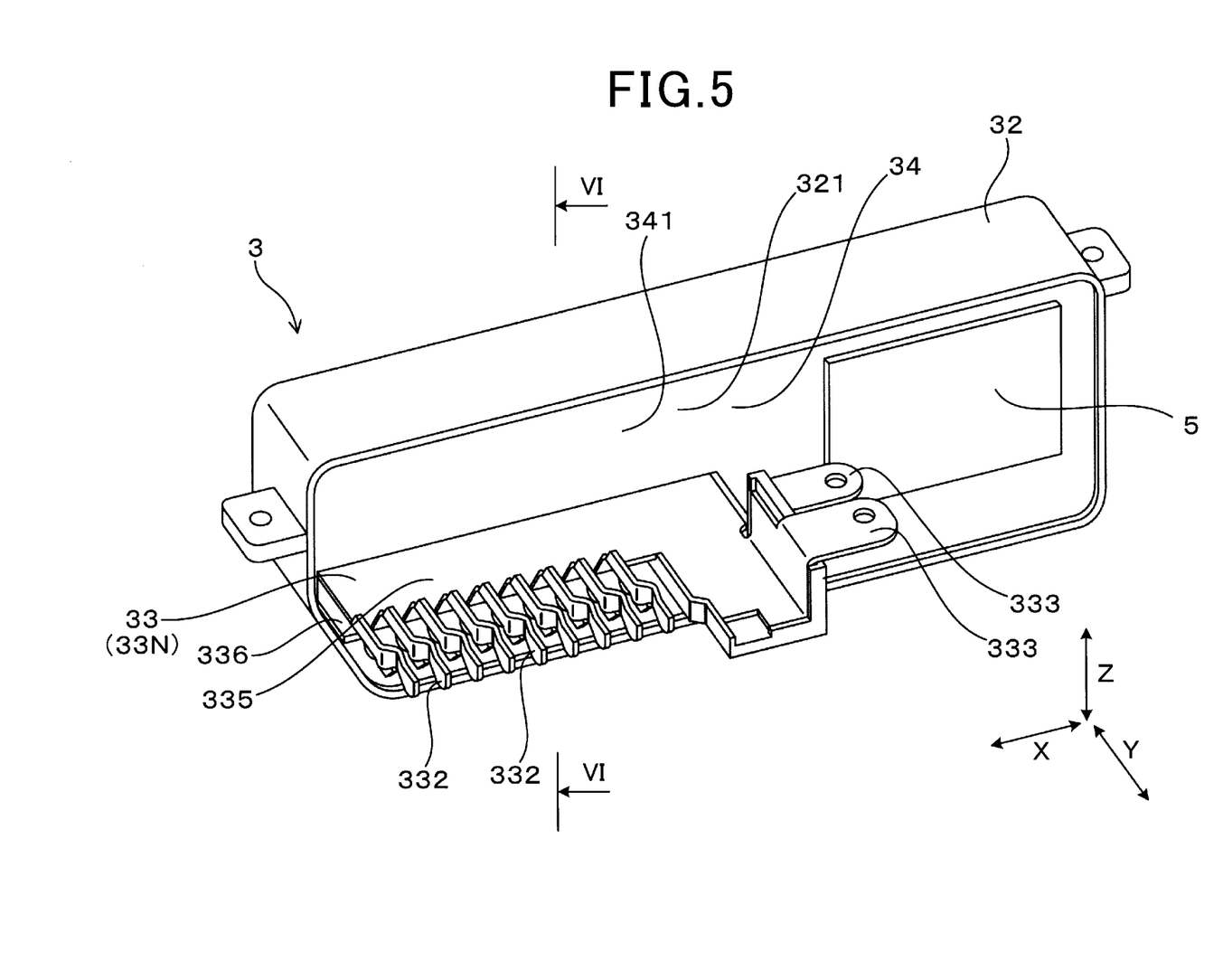
FIG. 5 is a perspective view of the first capacitor module in the first embodiment.

In the present embodiment, the discharging resistor 5 is formed by mounting a discharge resistance element on a substrate (not illustrated in the drawings). As shown in FIGS. 3 to 5, the normal direction of the discharging resistor 5 (that is, the normal direction of the substrate) is oriented in the Y direction. As shown in FIG. 8, the discharging resistor 5 is connected in parallel to the first capacitor module 3 and the second capacitor module 4. This makes it possible to discharge electrical charge from the first capacitor module 3 and the second capacitor module 4 through the discharging resistor 5.

As shown in FIGS. 3, 4, and 7, like the first capacitor module 3, the second capacitor module 4 contains the second capacitor element 41 in the second case 42. The second capacitor element 41 is sealed by second sealing resin 44 in the second case 42. The second case 42 has an opening surface 421 facing the first capacitor module 3 side in the Y direction. That is, the second capacitor module 4 has a second resin surface 441 of the second sealing resin 44 facing the first capacitor module 3 side in the Y direction.

As shown in FIG. 3, the first capacitor module 3 has the plurality of first capacitor elements 31, and the second capacitor module 4 has a plurality of second capacitor elements 41.

The second capacitor module 4 has the pair of second bus bars 43 that are connected to a pair of electrodes on the second capacitor element 41. These second bus bars 43 are extended over the outer surface of the second case 42. A positive second bus bar 43P protrudes from the opening surface 421 of the second case 42 and extends to the outer surface of the second case 42. Although not seen in FIG. 7, a negative second bus bar 43N also protrudes from the opening surface 421 and extends to the outer surface of the second case 42. As mainly shown by broken lines in FIG. 2, the second bus bar 43N has a Y-direction extension part 43Ny that overlaps the positive second bus bar 43P in a thickness direction while keeping insulation from the positive second bus bar 43P and extending in the Y direction. The second bus bar 43N has an X-direction extension part 43Nx that is arranged on the outer surface of the second case 42 so as to overlap and connect with a portion of the Y-direction extension part 43Ny and extend in the X direction. In the present embodiment, the Y-direction extension part 43Ny and the X-direction extension part 43Nx are formed of different members.

As shown in FIGS. 2 and 8, the power source connection parts 333 of the first bus bar 33 are connected to the direct-current power source BAT via the second bus bars 43. That is, the second bus bars 43 each have at one end inverter-side connection parts 432 connected to the first bus bar 33. The inverter-side connection parts 432 are connected by the fastening members 11 to the power source connection parts 333 of the first bus bar 33. The second bus bars 43 also each have at the other end a power source-side connection part 433 to which the connection wiring from the direct-current power source BAT is connected.

As shown in FIGS. 1 and 2, the power conversion apparatus 1 has an apparatus case 12 that accommodates the switching circuit part 20, the first capacitor module 3, and the second capacitor module 4. As shown in FIG. 1, the first capacitor module 3 is fixed to the apparatus case 12 by fixing members 133. As shown in FIG. 2, the second capacitor module 4 is fixed to the apparatus case 12 by fixing members 135.

The fixing members 135 for fixing the second capacitor module 4 and the fastening members 11 are the same in the fixing direction. That is, the fixing members 135 and the fastening members 11 are tightened in a direction from the front to back sides shown in FIG. 2. On the other hand, the fixing members 133 for fixing the first capacitor module 3 shown in FIG. 1 are opposite in the fixing direction to the fixing members 135 and the fastening members 11.

In the present embodiment, the fastening members 11 and the fixing members 133 and 135 can be both formed of bolts.

As described above, the first capacitor module 3 has, as the first bus bar 33, the positive first bus bar 33P and the negative first bus bar 33N. As shown in FIGS. 5 and 6, the positive first bus bar 33P and the negative first bus bar 33N have facing parts 335 facing each other in the thickness direction with an insulating layer 336 therebetween. The insulating layer 336 is formed of a resin molded body. The plurality of terminal connection parts 332 protrude from the facing parts 335 toward the side opposite to the first capacitor element 31 as seen in the Y direction.

As shown in FIGS. 3 to 5, the discharging resistor 5 is mounted on the first capacitor module 3. In the present embodiment, the first capacitor module 3 has the discharging resistor 5 disposed in a portion of a region to which the first bus bar 33 does not protrude in the X direction. The discharging resistor 5 is electrically connected to the first capacitor element 31 in the first capacitor module 3.

The discharging resistor 5 is fixed to the first case 32 and the like by fixing members such as bolts not illustrated in the drawings.

The first capacitor module 3 has the first sealing resin 34 that seals the first capacitor element 31 in the first case 32. The first sealing resin 34 has the first resin surface 341 that is exposed to the opening surface 321 of the first case 32. The second capacitor module 4 has second sealing resin 44 that seals the second capacitor element 41 in the second case 42. The second sealing resin 44 has the second resin surface 441 that is exposed to the opening surface 421 of the second case 42. The first capacitor module 3 and the second capacitor module 4 are arranged such that the first resin surface 341 and the second resin surface 441 face each other. The discharging resistor 5 is interposed between the first resin surface 341 and the second resin surface 441.

The substrate of the discharging resistor 5 is arranged substantially parallel to the first resin surface 341 and the second resin surface 441. As shown in FIGS. 3 to 6, the first resin surface 341 is more set back toward the first capacitor element 31 than the opening surface 321 of the first case 32 (that is, the end portion of the first case 32 on the second capacitor module 4 side). As shown in FIGS. 3, 4, and 7, the second resin surface 441 is more set back toward the second capacitor element 41 than the opening surface 421 of the second case 42 is positioned (that is, the end portion of the second case 42 on the first capacitor module 3 side).

At least a portion of the intervening part 431 is arranged outside the second sealing resin 44. As shown in FIGS. 4 and 7, in the present embodiment, the intervening part 431 has a buried intervention portion 431a that is buried in the second sealing resin 44 and an exposed intervention portion 431b that is exposed from the second sealing resin 44. In the present embodiment, the intervening part 431 is formed of a portion of the positive second bus bar 43P. The positive second bus bar 43P has an element connection part 434, an external terminal part 435, and the intervening part 431 that is formed between these parts.

The element connection part 434 is a part that is connected to the positive pole of the second capacitor element 41 and has a main surface oriented in the Z direction. The external terminal part 435 is disposed on the outer surface of the second case 42. The external terminal part 435 is positioned opposite to the element connection part 434 as seen in the Z direction with the second capacitor element 41 therebetween. The external terminal part 435 also has a main surface oriented in the Z direction.

The buried intervention portion 431a extends in the Z direction from an end edge of the element connection part 434 near the second resin surface 441. The exposed intervention portion 431b extends in the Z direction from an end edge of the external terminal part 435 on the first capacitor module 3 side. Both the buried intervention portion 431a and the exposed intervention portion 431b have main surfaces oriented in the Y direction. The buried intervention portion 431a and the exposed intervention portion 431b are coupled to each other by a coupling portion 431c with a main surface oriented in the Z direction. The coupling portion 431c protrudes from the second resin surface 441 in the Y direction.

The second sealing resin 44 intervenes between the buried intervention portion 431a and the second capacitor element 41 in a manner so as to be closely attached to the two.

There intervenes space between the exposed intervention portion 431b and the second resin surface 441.

As shown in FIG. 4, the first bus bar 33 of the first capacitor module 3 has an intervening part 331 that intervenes between the first capacitor element 31 and the discharging resistor 5, in a state of being separated from the two.

That is, the intervening part 331 of the first bus bar 33 is interposed between the first capacitor element 31 and the discharging resistor 5, but is separated from both the first capacitor elements 31 and the discharging resistor 5. That is, in the aligning direction of the first capacitor element 31 and the discharging resistor 5 (that is, the Y direction), there are provided a gap between the first capacitor element 31 and the intervening part 331 and a gap between the intervening part 331 and the discharging resistor 5.

In the present embodiment, the intervening part 331 is formed of a portion of the negative first bus bar 33N. The negative first bus bar 33N has an element connection part 337 that is connected to the negative pole of the first capacitor element 31. The first capacitor element 31 has the negative pole provided on the surface opposite to the opening surface 321 of the first case 32 as seen in the Y direction. The first bus bar 33N has an intermediate part 338 that extends from the element connection part 337 toward the opening surface 321 of the first case 32. The intervening part 331 is formed so as to extend in the Z direction from the end edge of the intermediate part on the opening surface 321 side.

The intervening part 331 is buried in the first sealing resin 34. The first sealing resin 34 is charged between the intervening part 331 and the first capacitor element 31, in a state of being closely attached to the two.

As stated above, the first capacitor module 3 is connected by the first bus bar 33 to the semiconductor modules 2 cooled by the cooler 220 as shown in FIGS. 1 and 2. Thus, the first capacitor module 3 is relatively likely to dissipate heat so that it is relatively easy to suppress a temperature rise in the first capacitor module 3. Furthermore, the first bus bar 33 is arranged in proximity to the cooler 220, which also facilitates the heat dissipation from the first capacitor module 3.

On the other hand, the second capacitor module 4 is separated from the cooler 220 in a heat transfer path through the second bus bar 43, the first bus bar 33, and the semiconductor modules 2, and thus is relatively unlikely to dissipate heat as compared to the first capacitor module 3. Furthermore, the second bus bar 43 of the second capacitor module 4 also serves as input wiring through which the input current flows from the direct-current power source BAT, and thus tends to rise in temperature. Therefore, in the present embodiment, if the heat from the discharging resistor 5 is equally received, the second capacitor module 4 is more likely to reach a high temperature than the first capacitor module 3.

As shown in FIG. 2, the power conversion apparatus 1 has a bus bar connection part 110 where the first bus bar 33 and the second bus bar 43 are connected to each other. The power conversion apparatus 1 also has a cooling body that cools its components. In the present embodiment, this cooling body is the cooler 220 described above. That is, the cooling body is the cooler 220 that cools the semiconductor modules 2 as the components of the power conversion apparatus 1. The bus bar connection part 110 is arranged so as to dissipate heat generated at the bus bar connection part 110 toward the cooler 220.

That is, the bus bar connection part 110 is arranged near the cooler 220. Thus, the bus bar connection part 110 can be cooled by the cooler 220. For example, there is no heat-generating member such as an electronic component between the cooler 220 and the bus bar connection part 110. The bus bar connection part 110 is arranged near the cooler 220 rather than the center of the second case 42, for example.

In the present embodiment, the bus bar connection part 110 is a fastened part that is fastened by the fastening members 11 such as bolts. However, the bus bar connection part 110 may be a welded part formed by welding or the like.

At least a portion of the cooling body is interposed between the bus bar connection part 110 and the semiconductor modules 2. The cooling body (that is, the cooler 220) has a plurality of refrigerant flow paths 221. The plurality of refrigerant flow paths 221 is stacked and arranged together with the semiconductor modules 2 to constitute a stack body 200. A refrigerant flow path 221r at one end of the stack body 200 as seen in the stacking direction is interposed between the semiconductor modules 2 and the bus bar connection part 110 as seen in the stacking direction.

In the present embodiment, the cooling tube 22r disposed at one end of the cooler 220 as seen in the X direction is interposed between the bus bar connection part 110 and the semiconductor modules 2. That is, the refrigerant flow path 221r inside the cooling tube 22r is interposed between the bus bar connection part 110 and the semiconductor modules 2.

In other words, the bus bar connection part 110 is disposed opposite to the side of the cooling tube 22r on which the semiconductor modules 2 are disposed.

Next, operational advantages of the present embodiment will be described.

In the power conversion apparatus 1, the second bus bar 43 has the intervening part 431 between the second capacitor element 41 and the discharging resistor 5 that is a heat-generating component, in a state of being separated from the two. Accordingly, the intervening part 431 of the second bus bar 43 can block the heat moving from the discharging resistor 5 toward the second capacitor element 41. As a result, it is possible to suppress temperature rise in the second capacitor element 41.

The intervening part 431 blocking the movement of the heat is a part of the second bus bar 43. It is thus possible to suppress temperature rise in the second capacitor element 41 without particularly increasing the parts count. Therefore, the power conversion apparatus 1 can be downsized.

The discharging resistor 5 is mounted on the first capacitor module 3. This simplifies the assembly process of the discharging resistor 5 in the power conversion apparatus 1. This also makes it easy to reduce the arrangement space for the discharging resistor 5 and achieve the downsizing of the power conversion apparatus 1.

The first capacitor module 3 and the second capacitor module 4 are arranged such that the first resin surface 341 and the second resin surface 441 face each other. This makes it easy to ensure the space between the first resin surface 341 and the second resin surface 441. That is, it is easy to form the heat-insulation space by air between the first capacitor module 3 and the second capacitor module 4. The discharging resistor 5 is interposed between the first resin surface 341 and the second resin surface 441. This makes it easy to form the heat-insulation space between the first capacitor module 3, the second capacitor module 4 and the discharging resistor 5. As a result, it is easy to suppress reception of the heat from the discharging resistor 5 by the first capacitor elements 31 or the second capacitor elements 41.

At least a portion of the intervening part 431 is arranged outside the second sealing resin 44. That is, the intervening part 431 has the exposed intervention portion 431b. This makes it easy to dissipate the heat from the intervening part 431 to the outside. As a result, it is possible to effectively suppress temperature rise in the second capacitor element 41.

The first bus bar 33 has the intervening part 331 that intervenes between the first capacitor element 31 and the discharging resistor 5, in a state of being separated from the two. This suppresses receipt of the heat from the discharging resistor 5 by the first capacitor element 31.

The first bus bar 33 has the terminal connection parts 332 connected to the power terminals 21 of the switching circuit part 20, and the switching circuit part 20 has the cooler 220. Therefore, as described above, the first capacitor module 3 is relatively likely to dissipate heat so that it is relatively easy to suppress a temperature rise in the first capacitor module 3. Thus, providing the intervening part 431 with an excellent heat-shield function between the second capacitor element 41 and the discharging resistor 5 makes it possible to suppress heat damage to the second capacitor element 41 in a more effective manner.

The bus bar connection part 110 is arranged so as to dissipate the heat generated in the bus bar connection part 110 to the cooling body, that is, the cooler 220. This effectively cools the bus bar connection part 110 that is particularly likely to generate heat, in the current pathway. That is, the bus bar connection part 110 tends to have a relatively high electric resistance value, thereby easily generating Joule heat. The bus bar connection part 110 likely to generate a large quantity of heat is arranged in the vicinity of the cooler 220 or the like in order to easily dissipate the heat from the bus bar connection part 110 to the cooler 220. This improves dissipation of the heat from the entire power conversion apparatus 1.

The cooling body, that is, at least a part of the cooler 220 is interposed between the bus bar connection part 110 and the semiconductor modules 2. This allows the bus bar connection part 110 to be arranged in the cooler 220 on the side without the semiconductor modules 2. As a result, both the semiconductor modules 2 and the bus bar connection part 110 can be cooled efficiently.

The refrigerant flow path 221r at the one end of the stack body 200 is interposed between the semiconductor modules 2 and the bus bar connection part 110 as seen in the X direction. This allows efficient cooling of the bus bar connection part 110. Specifically, the refrigerant flow path 221r at the one end of the stack body 200 receives the heat of the semiconductor modules 2 from only one of the two sides as seen in the X direction. Therefore, the refrigerant in the refrigerant flow path 221r can have a relatively low temperature to exhibit high cooling performance. Thus, arranging the bus bar connection part 110 in proximity to the refrigerant flow path 221r allows efficient dissipation of the heat from the bus bar connection part 110.

As stated above, according to the present embodiment, it is possible to provide the power conversion apparatus that is capable of being downsized while suppressing the reception of the heat from the heat-generating component by the second capacitor element.

Second Embodiment

Figure 9:
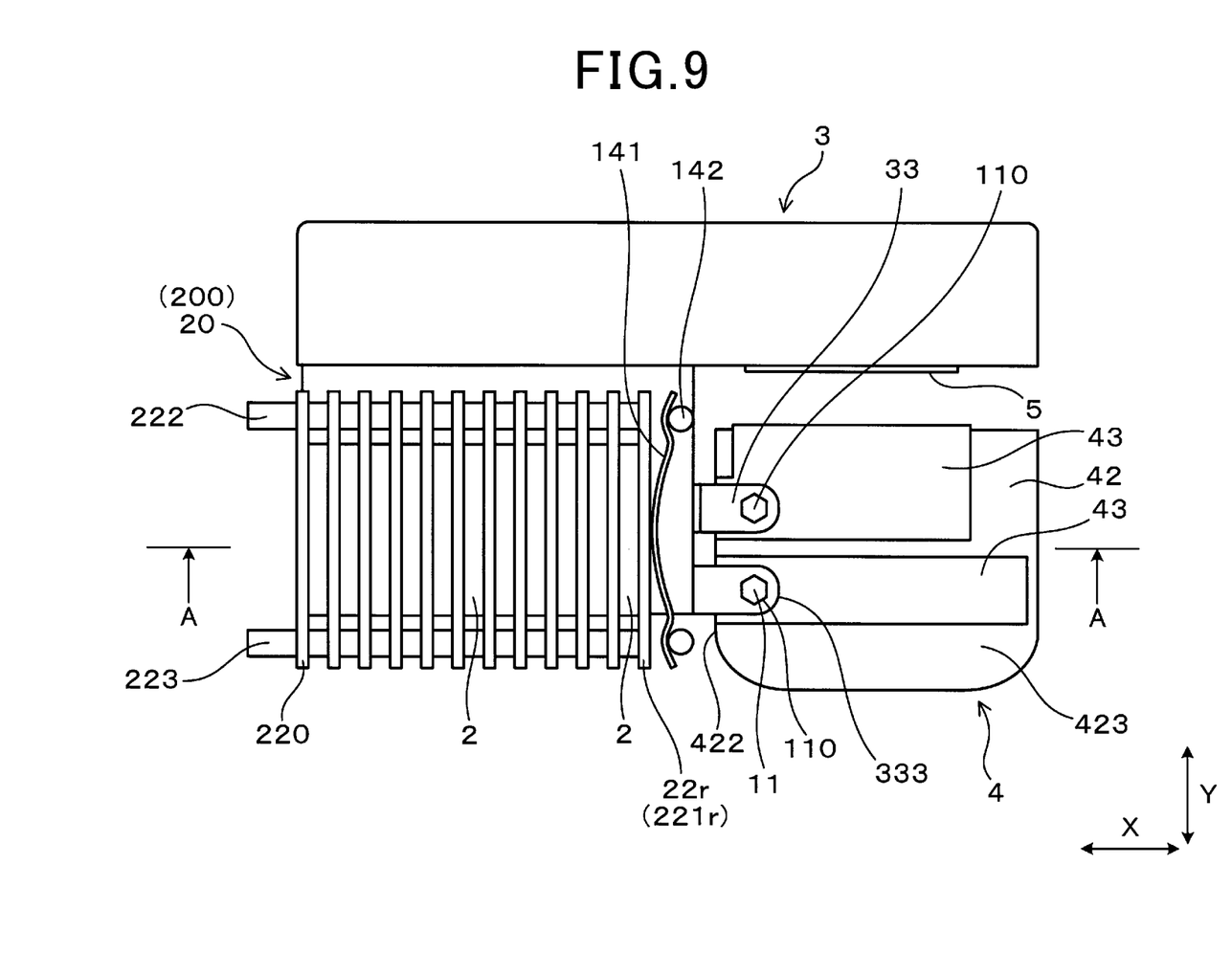
FIG. 9 is a descriptive plan view of a power conversion apparatus in a second embodiment.
Figure 10:
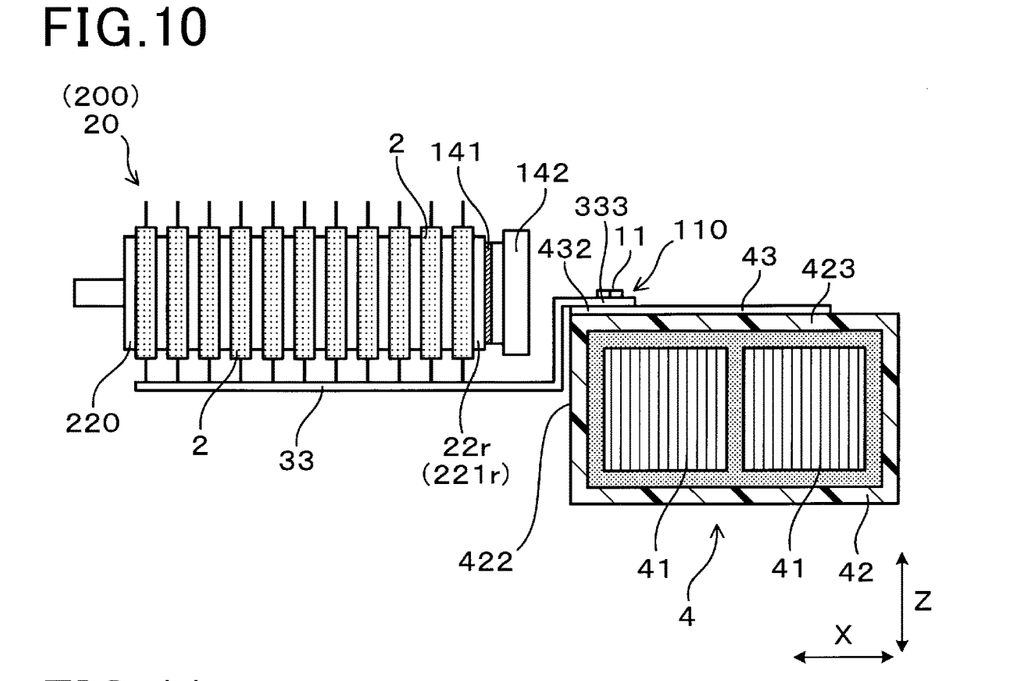
FIG. 10 is a cross-sectional view of FIG. 9 taken along line A-A.
Figure 11:
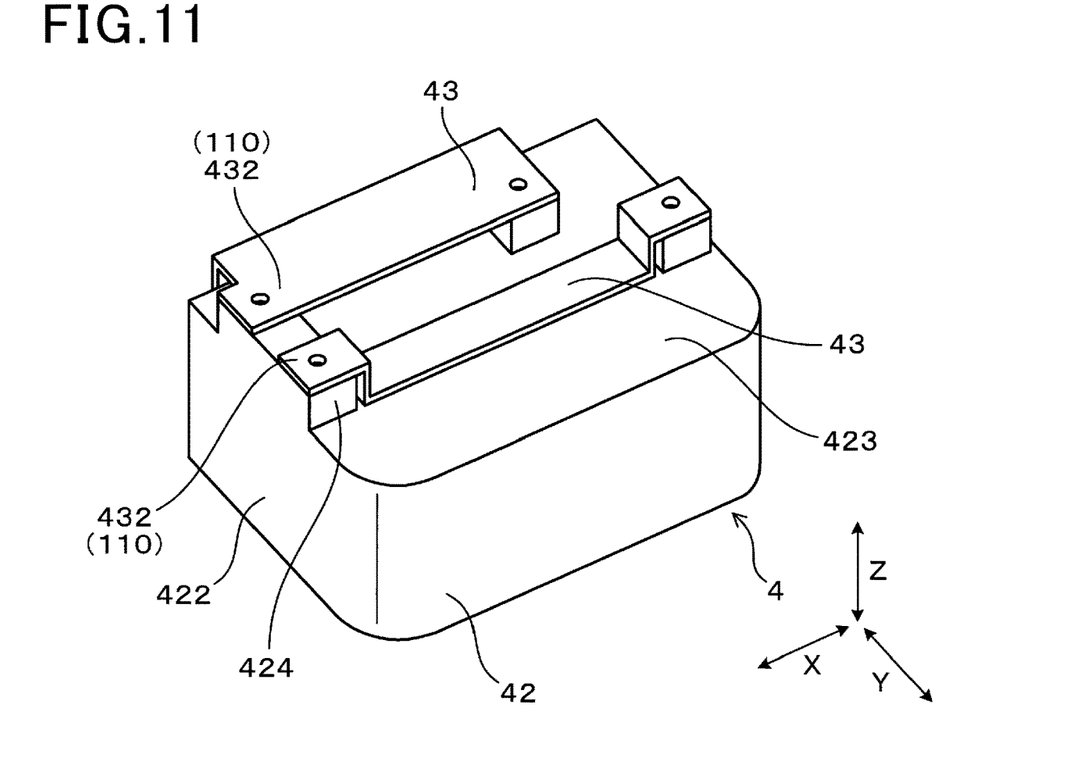
FIG. 11 is a perspective view of the power conversion apparatus in the second embodiment.

In the present embodiment, as shown in FIGS. 9 to 11, the relative positions and the like of the stack body 200 and the second capacitor module 4 are presented more specifically.

At least one of the first capacitor module 3 and the second capacitor module 4 is a cooling body-facing module that is arranged to face the cooling body. The bus bar connection part 110 is disposed in a case of the cooling body-facing module.

In the present embodiment, as shown in FIGS. 9 and 10, the second capacitor module 4 is the cooling body-facing module. Therefore, the bus bar connection part 110 is arranged in the second case 42 of the second capacitor module 4.

The stack body 200 has a pressurization member 141 arranged on one end side as seen in the X direction to pressurize the stack body 200. The pressurization member 141 is formed of a plate spring, for example, and supported by a bearing part 142 that is fixed to a part of the apparatus case 12 (see FIG. 1). The pressurization member 141 and the bearing part 142 can be made of metal. In the present embodiment, a refrigerant introduction part 222 to introduce the refrigerant into the cooler 220 and a refrigerant discharge part 223 are disposed on the cooling tube 22 at the end portion of the stack body 200 opposite to the pressurization member 141 as seen in the X direction.

The cooler 220 constituting the stack body 200 and the second capacitor module 4 are arranged to face each other in the X direction. That is, the cooling tube 22r at one end of the cooler 220 is arranged to face the second capacitor module 4 in proximity to the second capacitor module 4 in the X direction. However, the pressurization member 141 is interposed between the cooling tube 22r and the second capacitor module 4.

The distance between the cooling tube 22r and the second capacitor module 4 can be half or less the dimension of the second case 42 along the X direction, for example. As shown in FIGS. 9 to 11, the surface of the second capacitor module 4 facing the cooling tube 22r is formed at one side wall part of the second case 42. The side wall part will be hereinafter called facing wall part 422.

The bus bar connection part 110 is disposed on a top wall part 423 oriented in the Z direction in the second case 42, near the corner between the top wall part 423 and the facing wall part 422. That is, the bus bar connection part 110 is arranged on the top wall part 423 near the end portion close to the stack body 200.

As shown in FIG. 11, the second case 42 of the second capacitor module 4 has a terminal base 424 protruding in the Z direction on the top wall part 423. The terminal part of the second bus bar 43 is arranged on the terminal base 424. The terminal parts of the first bus bar 33 (that is, the power source connection parts 333) are arranged to overlap the terminal parts of the second bus bar 43 (that is, the inverter-side connection parts 432) arranged on the terminal base 424. The terminal parts of the first bus bar 33 and the terminal parts of the second bus bar 43 are fastened together by the fastening members 11 such as bolts. The fastened parts constitute the bus bar connection part 110. FIG. 10 and others do not show the terminal base 424.

In other respects, the second embodiment is similar to the first embodiment. Among the reference signs used in the second embodiment and later, the reference signs identical to those used in the preceding embodiments represent components similar to those in the preceding embodiments unless otherwise specified.

In the present embodiment, the bus bar connection part 110 is disposed in the second case 42 of the second capacitor module 4 that is the cooling body-facing module arranged to face the cooling body. This allows the bus bar connection part 110 to be cooled more efficiently. Specifically, the second case 42 of the second capacitor module 4 arranged to face the cooler 220 can be easily cooled by the cooler 220. Therefore, providing the bus bar connection part 110 in the second case 42 facilitates dissipation of the heat from the bus bar connection part 110 via the second case 42.

In particular, the bus bar connection part 110 is arranged at the corner between the top wall part 423 and the facing wall part 422 of the second case 42. This shortens the heat transfer distance from the bus bar connection part 110 to the facing wall part 422, which allows further effective cooling of the bus bar connection part 110.

Besides, the second embodiment produces operational effects similar to those of the first embodiment.

Third Embodiment

Figure 12:
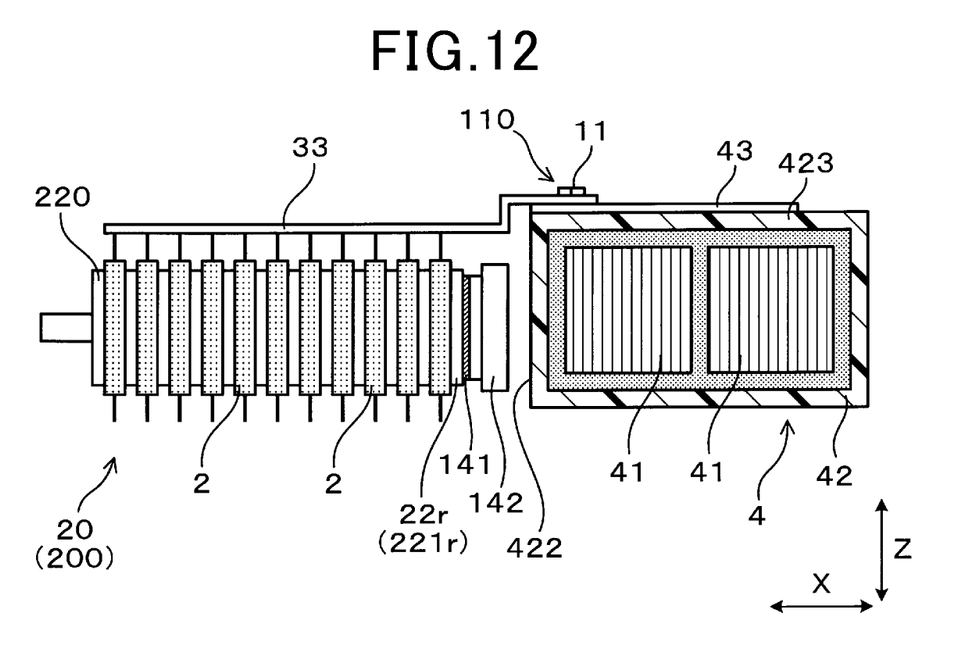
FIG. 12 is an explanatory cross-sectional view of a power conversion apparatus in a third embodiment.

In the present embodiment, as shown in FIG. 12, the first bus bar 33 is arranged on the same side as both the stack body 200 and the second capacitor module 4 as seen in the Z direction.

In other respects, the third embodiment is similar to the second embodiment.

In this case, the facing area of the stack body 200 and the second capacitor module 4 can be easily increased. Therefore, the facing area of the facing wall part 422 of the second capacitor module 4 and the cooling tube 22r becomes likely to be large. As a result, the facing wall part 422 can be easily cooled, and the bus bar connection part 110 disposed near the facing wall part 422 can also be easily cooled.

Besides, the third embodiment produces operational effects similar to those of the second embodiment.

In the foregoing embodiments, the discharge resistor is arranged as the heat-generating component. However, the heat-generating component is not limited thereto. Examples of the heat-generating component include reactors, temperature sensors (thermistors), current sensors, and electronic components such as electronic circuit substrates.

In the foregoing embodiments, the first bus bar 33 is provided with the intervening part 331. However, the first bus bar 33 may have no intervening part. In particular, when heat damage to the second capacitor element 41 is more of a concern than that to the first capacitor element 31, the second bus bar 43 may have the intervening part 431 and the first bus bar 33 may not have the intervening part 331.

The present disclosure is not limited to the foregoing embodiments but is also applicable to various embodiments without deviating from the scope of the present disclosure.

The present disclosure has been described so far according to the embodiments, but it is noted that the present disclosure is not limited to the foregoing embodiments or structures. The present disclosure also includes various modifications and changes in a range of equivalency. In addition, various combinations and modes, and other combinations and modes including only one element of the foregoing combinations and modes, less or more than the one element are included in the scope and conceptual range of the present disclosure.

CONCLUSION

The present disclosure is intended to provide a power conversion apparatus that is capable of being downsized while suppressing the reception of heat from a heat-generating component by a second capacitor element.

One aspect of the present disclosure is in a power conversion apparatus having: a heat-generating component; and a first capacitor module and a second capacitor module that are arranged to face each other with the heat-generating component therebetween. The first capacitor module has a first capacitor element, a first case that accommodates the first capacitor element, and a first bus bar with one end connected to the first capacitor element, the second capacitor module has a second capacitor element, a second case that accommodates the second capacitor element, and a second bus bar with one end connected to the second capacitor element, and the second bus bar has an that intervenes between the second capacitor element and the heat-generating component, in a state of being separated from the two.

In the power conversion apparatus, the second bus bar has the intervening part that intervenes between the second capacitor element and the heat-generating component, in the state of being separated from the two. Thus, the intervening part of the second bus bar can block heat transfer from the heat-generating component to the second capacitor element. As a result, it is possible to suppress the temperature rise in the second capacitor element.

The intervening part to block the movement of the heat described above is a part of the second bus bar. This suppresses the temperature rise in the second capacitor element without particularly increasing the parts count. Therefore, it is also possible to facilitate downsizing of the power conversion apparatus.

As stated above, according to the foregoing aspect, it is possible to provide the power conversion apparatus that is capable of being downsized while suppressing the reception of the heat from the heat-generating component by the second capacitor element.

What is claimed is:

1. A power conversion apparatus comprising:
a heat-generating component; and
a first capacitor module and a second capacitor module that are arranged to face each other with the heat-generating component therebetween, wherein
the first capacitor module has a first capacitor element, a first case that accommodates the first capacitor element, a first bus bar with one end connected to the first capacitor element, and first sealing resin that seals the first capacitor element in the first case,
the first sealing resin has a first resin surface that is exposed to an opening surface of the first case,
the second capacitor module has a second capacitor element, a second case that accommodates the second capacitor element, a second bus bar with one end connected to the second capacitor element, second sealing resin that seals the second capacitor element in the second case,
the second sealing resin has a second resin surface that is exposed to an opening surface of the second case,
the first capacitor module and the second capacitor module are arranged such that the first resin surface and the second resin surface face each other, and
the heat-generating component is interposed between the first resin surface and the second resin surface, and
the second bus bar has an intervening part that intervenes between the second capacitor element and the heat-generating component, in a state of being separated from the second capacitor element and the heat-generating component.

2. The power conversion apparatus according to claim 1, wherein the heat-generating component is mounted on the first capacitor module.

3. The power conversion apparatus according to claim 1, wherein at least a portion of the intervening part is arranged outside the second sealing resin.

4. The power conversion apparatus according to claim 1, wherein the first bus bar has an intervening part that intervenes between the first capacitor element and the heat-generating component, in a state of being separated from the two.

5. The power conversion apparatus according to claim 1, wherein
the first bus bar has a terminal connection part that is connected to a power terminal of a switching circuit part, and
the switching circuit part has a semiconductor module and a cooler that cools the semiconductor module.

6. The power conversion apparatus according to claim 1, comprising:
a bus bar connection part where the first bus bar and the second bus bar are connected to each other; and
a cooling body that cools components of the power conversion apparatus, wherein
the bus bar connection part is arranged so as to dissipate heat generated in the bus bar connection part to the cooling body.

7. The power conversion apparatus according to claim 6, wherein
- the first bus bar has a terminal connection part that is connected to a power terminal of a switching circuit part,
- the switching circuit part has a semiconductor module,
- the cooling body is configured to cool the semiconductor module, and
- at least a part of the cooling body is interposed between the bus bar connection part and the semiconductor module.

8. The power conversion apparatus according to claim 7, wherein
- the cooling body has a plurality of refrigerant flow paths,
- the plurality of refrigerant flow paths are stacked and arranged together with the semiconductor module to constitute a stack body, and
- the refrigerant flow path at one end of the stack body as seen in a stacking direction is interposed between the semiconductor module and the bus bar connection part as seen in the stacking direction.

9. The power conversion apparatus according to claim 6, wherein
- at least one of the first capacitor module and the second capacitor module is a cooling body-facing module that is arranged to face the cooling body, and
- the bus bar connection part is disposed in a case of the cooling body-facing module.

* * * * *